United States Patent
Gordon et al.

(10) Patent No.: US 12,183,836 B2
(45) Date of Patent: Dec. 31, 2024

(54) RECONFIGURABLE SOLAR ARRAY FOR STABLE OUTPUT VOLTAGE OVER A RANGE OF TEMPERATURES WITH HIGH OPERATIONAL EFFICIENCY

(71) Applicant: Northrop Grumman Systems Corporation, Falls Church, VA (US)

(72) Inventors: Jay Michael Gordon, Ellicott City, MD (US); Paul James Matthews, Ellicott City, MD (US); Thomas Joseph Knight, Rockville, MD (US)

(73) Assignee: Northrop Grumman Systems Corporation, Falls Church, VA (US)

( * ) Notice: Subject to any disclaimer, the term of this patent is extended or adjusted under 35 U.S.C. 154(b) by 0 days.

(21) Appl. No.: 17/721,469

(22) Filed: Apr. 15, 2022

(65) Prior Publication Data

US 2023/0335651 A1  Oct. 19, 2023

(51) Int. Cl.
*H01L 31/02* (2006.01)
*H02J 13/00* (2006.01)
(Continued)

(52) U.S. Cl.
CPC .. *H01L 31/02021* (2013.01); *H02J 13/00036* (2020.01); *H02S 40/36* (2014.12); *H02S 40/40* (2014.12); *H02S 50/00* (2013.01)

(58) Field of Classification Search
CPC ....................................................... H02S 40/40
See application file for complete search history.

(56) References Cited

U.S. PATENT DOCUMENTS

| | | | |
|---|---|---|---|
| 4,175,249 A | 11/1979 | Gruber | |
| 4,490,668 A * | 12/1984 | Sterzer | H02M 3/155 |
| | | | 244/179 |

(Continued)

FOREIGN PATENT DOCUMENTS

| | | | | |
|---|---|---|---|---|
| CN | 205981480 U | * | 2/2017 | |
| DE | 102010007495 A1 | * | 8/2011 | ....... H01L 31/02021 |

(Continued)

OTHER PUBLICATIONS

Machine translation of CN205981480U (Year: 2017).*
(Continued)

*Primary Examiner* — Ryan S Cannon
(74) *Attorney, Agent, or Firm* — Dority & Manning, P.A.

(57) ABSTRACT

A reconfigurable solar array has a plurality of photovoltaic cells and an interconnect circuit including a plurality of switches for interconnecting the photovoltaic cells. A thermostatic feedback control circuit in communication with a temperature sensor is configured to produce a temperature signal that is proportional to a temperature of the photovoltaic cells. The thermostatic feedback control circuit is configured to cause at least one of the switches to change state at a preset temperature that is independent of supply voltage. When the temperature is above the preset temperature, the photovoltaic cells are arranged in a plurality of strings connected in parallel. When the temperature is at or below the preset temperature, at least one photovoltaic cell in each string is disconnected from a respective string and reconnected in series to each other to form a new string connected in parallel to the other strings.

17 Claims, 10 Drawing Sheets

(51) Int. Cl.
    *H02S 40/36*     (2014.01)
    *H02S 40/40*     (2014.01)
    *H02S 50/00*     (2014.01)

(56) References Cited

U.S. PATENT DOCUMENTS

| | | | |
|---|---|---|---|
| 5,500,052 | A | 3/1996 | Horiuchi et al. |
| 6,060,790 | A * | 5/2000 | Craig, Jr. .................. H02J 7/35 307/85 |
| 6,350,944 | B1 | 2/2002 | Sherif et al. |
| 6,583,522 | B1 | 6/2003 | McNulty et al. |
| 9,815,575 | B2 | 11/2017 | Levy |
| 2010/0186799 | A1 | 7/2010 | Gaul |
| 2011/0140532 | A1 | 6/2011 | Cherukupalli |
| 2011/0220182 | A1* | 9/2011 | Lin ..................... H01L 31/0504 136/251 |
| 2012/0112557 | A1 | 5/2012 | Sager |
| 2012/0313455 | A1 | 12/2012 | Latham |
| 2014/0137928 | A1 | 5/2014 | Wiedeman et al. |
| 2016/0218668 | A1 | 7/2016 | Kono et al. |
| 2016/0372929 | A1 | 12/2016 | Ishikawa |
| 2018/0358497 | A1* | 12/2018 | Rehder ................. H01L 31/042 |
| 2023/0055374 | A1* | 2/2023 | Kaufman ................. H02S 40/40 |

FOREIGN PATENT DOCUMENTS

| | | |
|---|---|---|
| EP | 1160876 B1 | 11/2014 |
| GB | 1424383 A | 2/1976 |
| JP | 2007189256 A | 7/2007 |
| KR | 20180025803 A | 3/2018 |
| WO | 2009/060273 A1 | 5/2009 |
| WO | 2020/246951 A1 | 12/2020 |

OTHER PUBLICATIONS

Machine translation of DE102010007495A1 (Year: 2010).*
International Search Report Corresponding to Application No. PCT/US2023/065195 on Jul. 28, 2023.
Heblikar, A., "Reconfigurable Solar Array Interface for Maximum Power Extraction in Spacecrafts," Masters Thesis, Arizona State University (Dec. 2019), 67 pages.
Andrew Levy, "Alphacore Presentation at Space Power Workshop 2021—Dynamic Reconfiguration Strategy for Solar Arrays on Spacecrafts Using eGaN Switches", Alphacore Presentation at Space Power Workshop 2021—Dynamic Reconfiguration Strategy for Solar Arrays on Spacecrafts Using eGaN Switches, 19 pages.

* cited by examiner

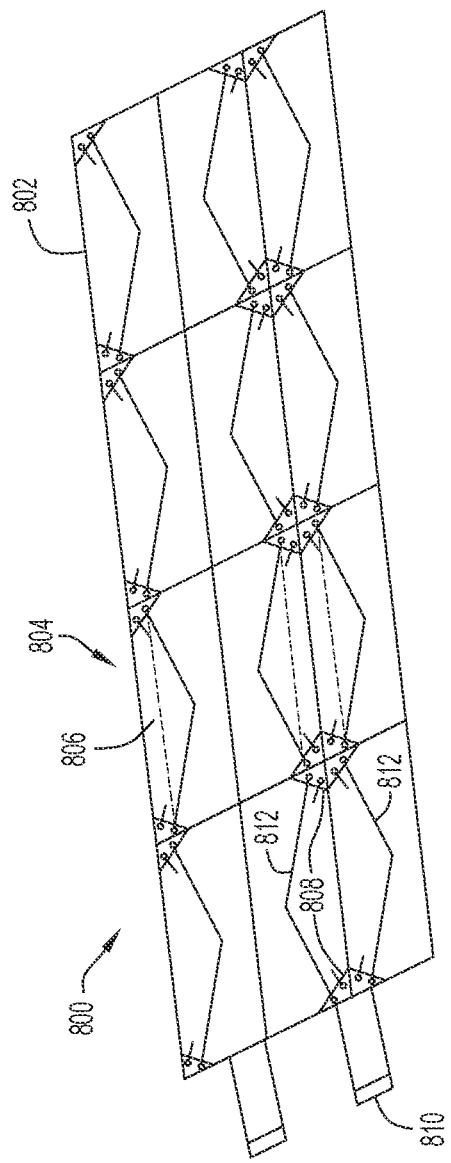
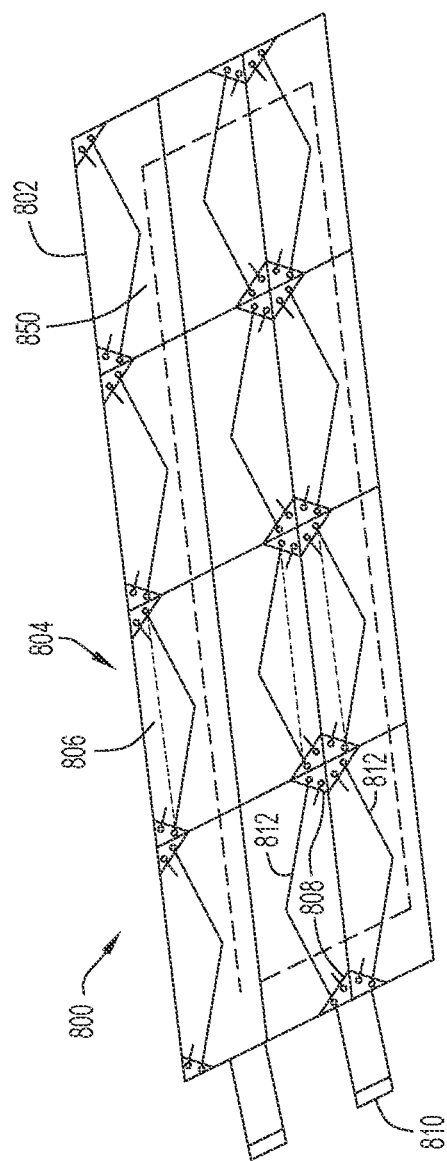

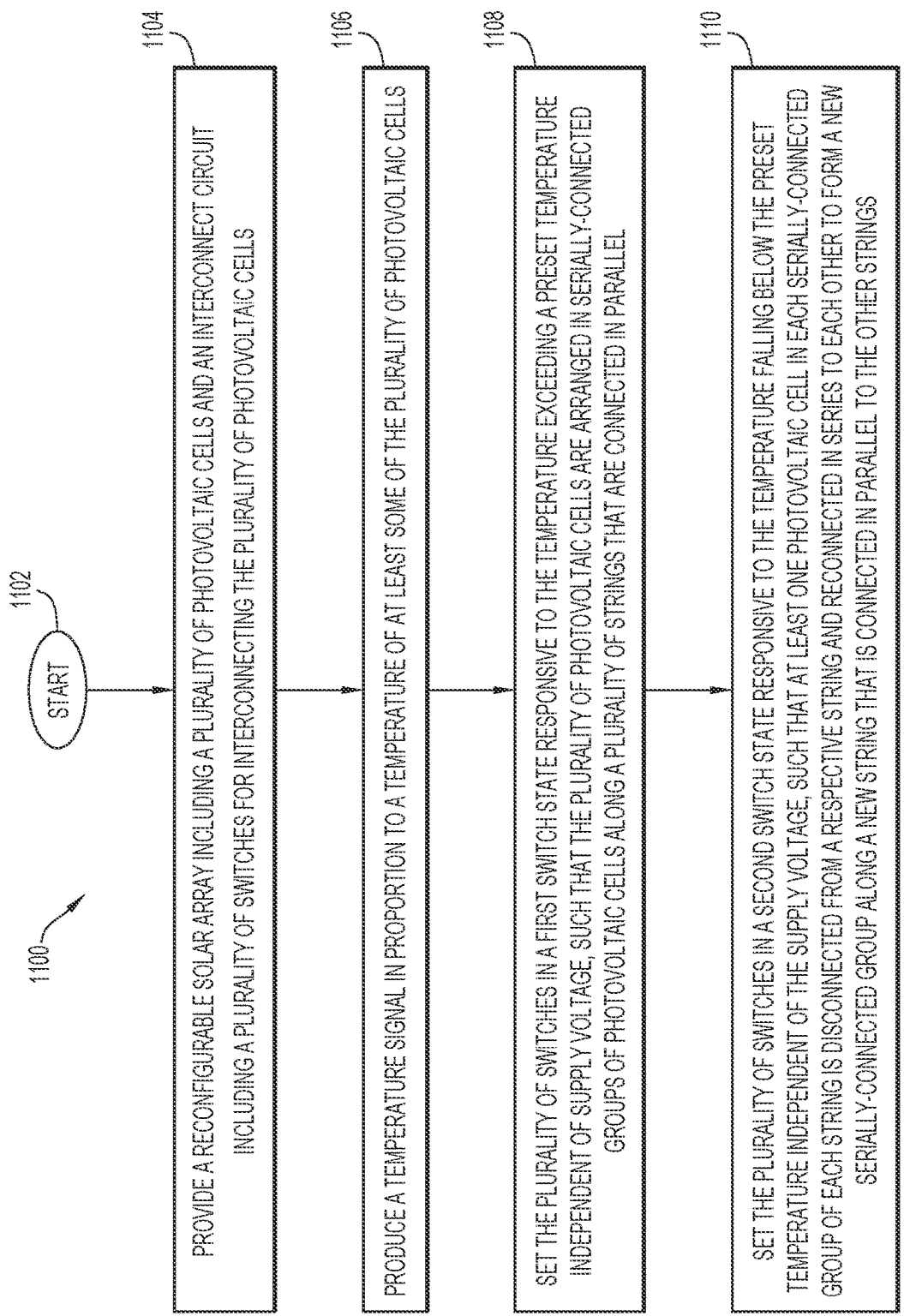

RECONFIGURABLE SOLAR ARRAY FOR STABLE OUTPUT VOLTAGE OVER A RANGE OF TEMPERATURES WITH HIGH OPERATIONAL EFFICIENCY

TECHNICAL FIELD

The present disclosure relates generally to solar arrays, such as space solar arrays for space-based solar power systems, and more particularly to reconfigurable solar arrays configured to provide stable output voltages over a range of temperatures with high operational efficiencies.

BACKGROUND

A space-based solar power system is a solar power system that collects solar energy from the sun in outer space and transmits it to earth in the form of electromagnetic waves. Such a solar power system typically includes a solar power transmitting apparatus carried on a satellite (e.g., having one or more solar arrays with photovoltaic (PV) cells) and a solar power receiving apparatus positioned on earth.

Unfortunately, large temperature swings and angle of incidence (AOI) fluctuations cause (even optimized) solar arrays to produce large variations in voltage and power. These variations may cause large efficiency degradations in direct current (DC) to radio frequency (RF) (DC-to-RF) conversion (often implemented in the form of an RF integrated circuit (IC) which receives the widely-varying DC voltage for conversion) and consequently large power losses in the system. These inefficiencies result in a rise in temperature, which in turn degrades the system even further.

To illustrate by example, one space solar power architecture is required to accommodate a temperature range from −50° C. to 125° C. as its solar array passes in and out of eclipse and encounters direct and high angle sunlight. Even larger temperature variations are expected in middle earth orbit (MEO). Such varying conditions produce a wide set of power and voltage conditions for the solar array. In this example, the voltage at maximum power (i.e., VMP) may range from 2.78-5.51 volts (V) and the DC power may also range widely from 7.2-26.4 watts (W). Under these conditions, power management and distribution, and ultimately conversion to RF power are strained.

SUMMARY OF THE INVENTION

A reconfigurable solar array of the present disclosure is configured to provide a stable output voltage over a range of temperatures with high operational efficiency.

In one illustrative example, the reconfigurable solar array has a plurality of photovoltaic cells and an interconnect circuit including a plurality of switches for interconnecting the photovoltaic cells. A thermostatic feedback control circuit in communication with a temperature sensor is configured to produce a temperature signal that is proportional to a temperature of the photovoltaic cells. The thermostatic feedback control circuit is configured to cause at least one of the switches to change state at a preset temperature that is independent of supply voltage. When the temperature is above the preset temperature, the photovoltaic cells are arranged in a plurality of strings connected in parallel. When the temperature is at or below the preset temperature, at least one photovoltaic cell in each string is disconnected from a respective string and reconnected in series to each other to form a new string connected in parallel to the other strings.

More detailed and alternative techniques and implementations are provided herein as described below.

BRIEF DESCRIPTION OF THE DRAWINGS

So that the present disclosure can be understood by those of ordinary skill in the art, a more detailed description may be had by reference to aspects of some illustrative implementations, some of which are shown in the accompanying drawings.

FIGS. 8A and 8B are perspective views of a flexible printed circuit board which may be used to form part of a reconfigurable solar array according to some implementations of the present disclosure;

FIG. 11 is a flowchart for describing a method for use in operating a reconfigurable solar array according to some implementations of the present disclosure.

DESCRIPTION OF EXAMPLE EMBODIMENTS

Figure 1:
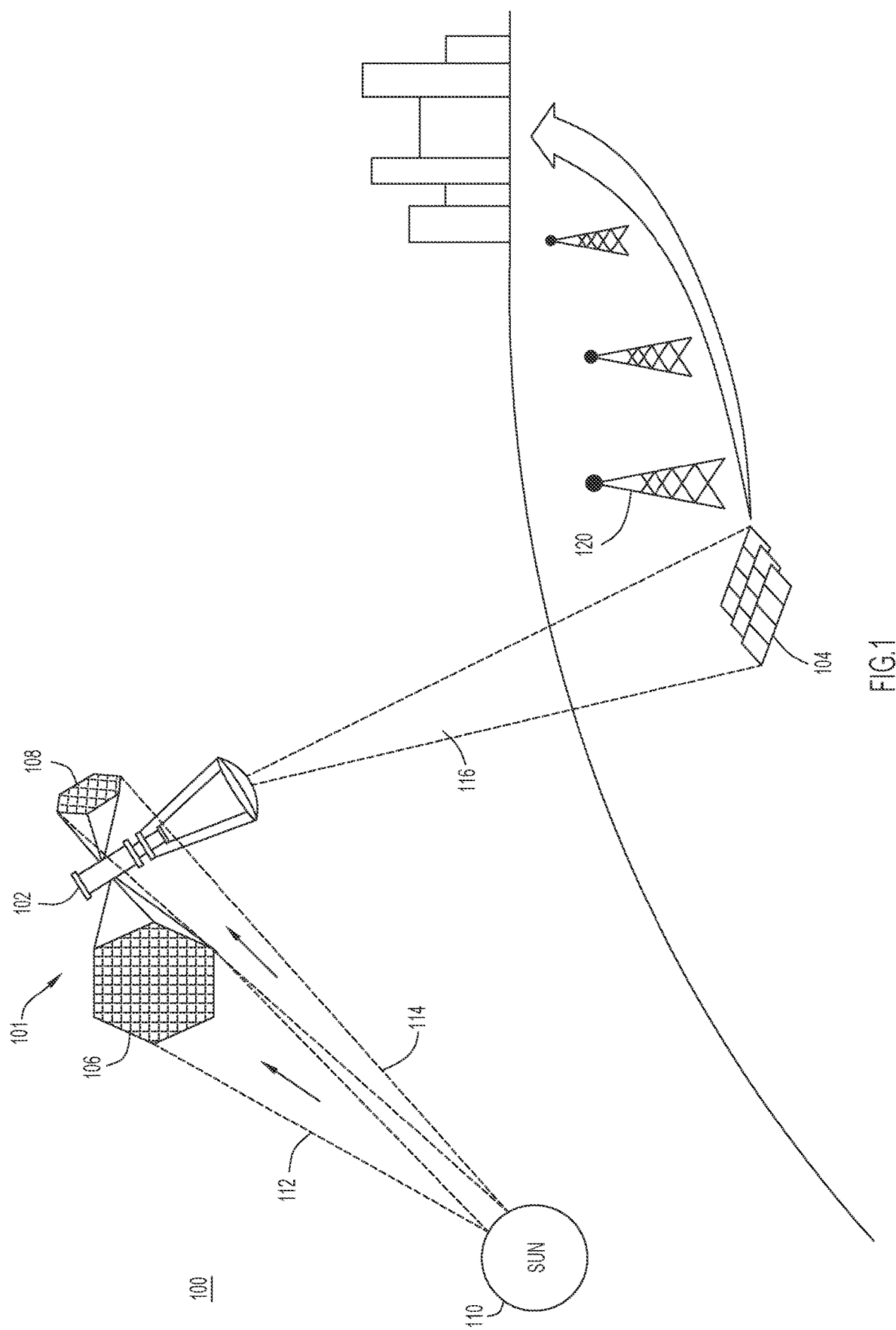
FIG. 1 is an illustrative representation of a solar power system which may incorporate at least some inventive aspects of the present disclosure, where the solar power system is a space-based solar power system.

Numerous details are described here in order to provide a thorough understanding of the example implementations shown in the drawings. However, the drawings merely show some example aspects of the present disclosure and are therefore not to be considered limiting. Those of ordinary skill in the art will appreciate that other effective aspects and/or variants do not include all of the specific details described herein. Moreover, well-known systems, methods, components, devices and circuits have not been described in exhaustive detail so as not to obscure more pertinent aspects of the example implementations described herein.

Described herein are approaches to address several critical challenges in the design of a space solar power system and space solar arrays in general. Although developed for space solar power systems, these approaches are suitable for use in commercial and terrestrial applications in which, for example, architectural or scavenging solar arrays are designed without the use of mechanical sun tracking components.

FIG. 1 is an illustrative representation of a solar power system 100 which may incorporate at least some inventive aspects of the present disclosure. In FIG. 1, solar power system 100 is a spaced-based solar power system where solar energy from a sun 110 is collected in space and transmitted to earth in the form of electromagnetic waves. In general, solar power system 100 includes a solar power transmitting apparatus 102 carried on a satellite 101 and a solar power receiving apparatus 104 positioned on earth.

More particularly, solar power transmitting apparatus 102 of FIG. 1 may operate with use of one or more solar arrays 106, 108 carried on the satellite 101 in order to receive solar radiation waves 112, 114 from the sun 110. Photovoltaic (PV) cells in one or more solar arrays 106, 108 are configured to convert solar radiation waves 112, 114 into electrical energy in the form of a direct current (DC) signal. Solar power transmitting apparatus 102 operates to convert the DC signal into electromagnetic waves, specifically in the form of an electromagnetic beam 116 (e.g., radio frequency (RF), microwave, or laser). Electromagnetic beam 116 is directed toward solar power receiving apparatus 104 on earth, for conversion of its electromagnetic energy into electrical energy in the form of a DC signal. Solar power receiving apparatus 104 may convert the DC signal into an alternating current (AC) signal to supply power to a power utility 120. In some implementations, power utility 120 may be or include a power management and distribution system (PMAD). Notably, space-based solar power systems can deliver power to arbitrary points even if they are off-grid, and can also "top-off" power at dawn and dusk when electricity usage is the highest. In alternative implementations, solar power receiving apparatus 104 may apply the DC signal (e.g., via a DC-to-DC converter, or a charging controller) to charge one or more batteries.

Figure 2:
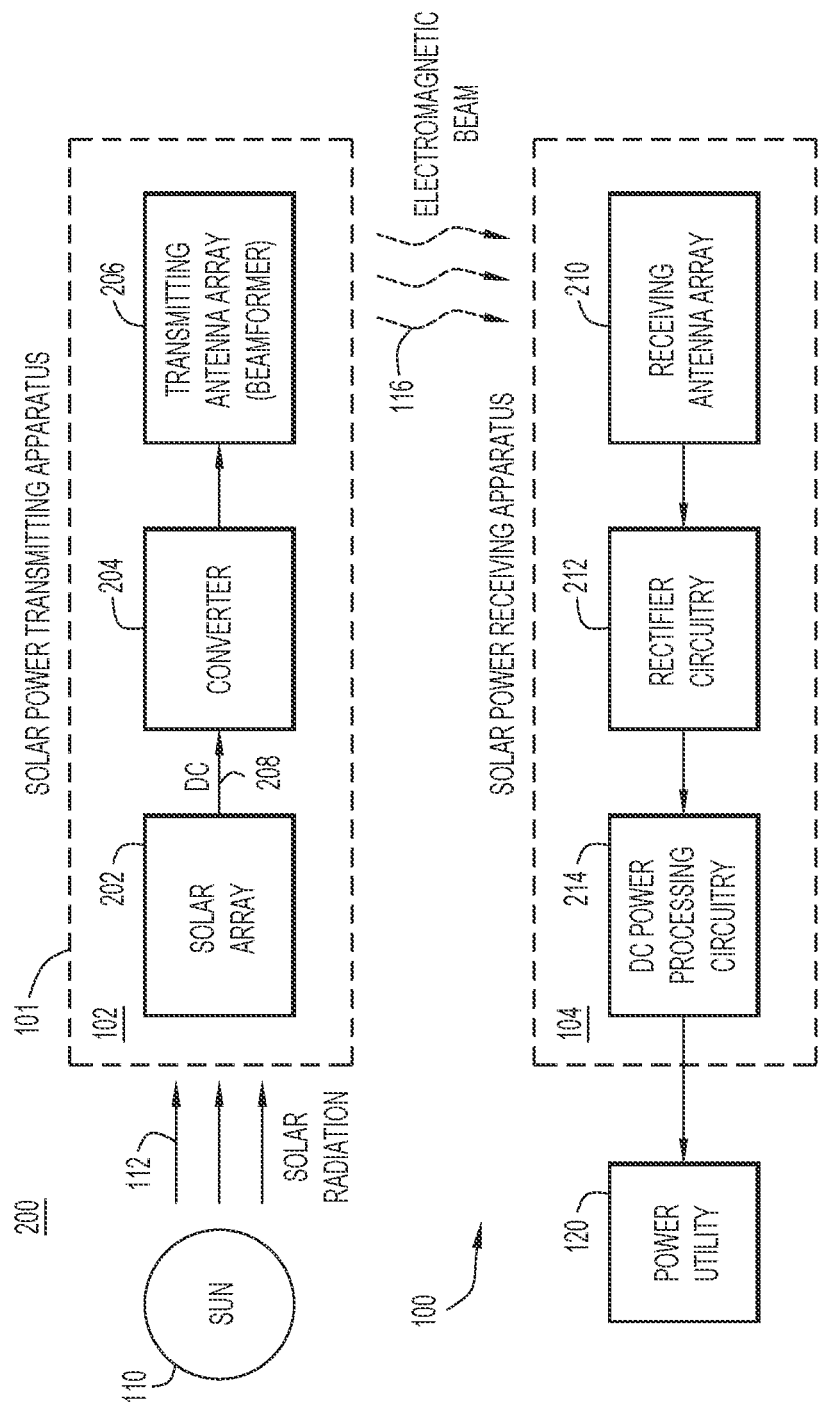
FIG. 2 is a schematic block diagram of the solar power system of FIG. 1 (i.e., the space-based solar power system) to provide more detail.

FIG. 2 is a schematic block diagram 200 of the solar power system of FIG. 1 (i.e., the space-based solar power system) which provides more detail. In FIG. 2, solar power transmitting apparatus 102 which is carried on satellite 101 (or other station or vehicle in space) may include a solar array 202, a converter 204, and a transmitting antenna array 206. Solar array 202 has PV cells to convert solar radiation waves 112 into electrical energy in the form of a DC signal 208. Converter 204 may convert the DC signal 208 into electromagnetic waves and form the electromagnetic beam 116 with use of transmitting antenna array 206. Electromagnetic beam 116 (e.g., RF, microwave, or laser) may be directed toward solar power receiving apparatus 104 (e.g., on earth). In some implementations, converter 204 may be or be referred to as a DC-to-RF converter, often provided in the form of an RF integrated circuit (IC) (RF IC) which is configured to receive the DC voltage for conversion.

Solar power receiving apparatus 104 of FIG. 2 may include a receiving antenna array 210, rectifier circuitry 212, and DC power processing circuitry 214. Receiving antenna array 210 may receive and detect signals of electromagnetic beam 116 from solar power transmitting apparatus 102, and rectifier circuitry 212 may convert them into electrical energy in the form of a DC signal. DC power processing circuitry 214 may convert the DC signal into an AC signal to supply power to power utility 120. In some implementations, DC power processing circuitry 214 may be or be referred to as DC-to-AC converter or an inverter. Alternatively, solar power receiving apparatus 104 may apply the DC signal (or via a DC-to-DC converter, or a charging controller) to charge one or more batteries.

The techniques and mechanisms of the present disclosure may be suitable for use in a space-based solar power system of FIGS. 1 and 2, as the voltage and power variations experienced in this type of system may cause large efficiency degradations for the appropriate DC-to-RF conversion to take place and consequently large power losses. In some implementations, the solar power system of FIGS. 1 and 2 may be utilized in a different application or context. As one example, the solar power system of FIGS. 1 and 2 may be a terrestrial-based solar power system utilized to supply power to a remote location on or above earth, or even, for example, an unmanned aerial vehicle (UAV) or drone in flight. Here, solar radiation waves may be collected by a solar array on earth for conversion into DC voltage, and the DC voltage may be converted into electromagnetic waves which may be beamed toward the remote location or UAV.

Figure 3:
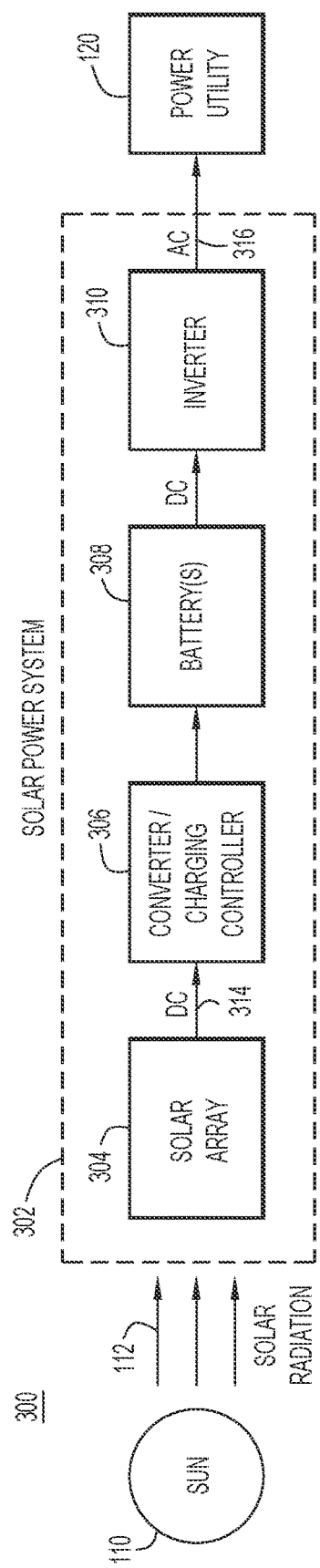
FIG. 3 is a schematic block diagram of another solar power system which may also incorporate at least some inventive aspects of the present disclosure, where the solar power system is an earth or land-based solar power system.

FIG. 3 is a schematic block diagram 300 of a solar power system 302 which may also incorporate at least some inventive aspects of the present disclosure. Solar power system 302 of FIG. 3 is different from the space-based solar power system of FIG. 1, in that it is without electromagnetic wave conversion as is common in the land-based residential or commercial context (e.g., for use on earth). On the other hand, solar power system 302 of FIG. 3 may alternatively be provided in a space-based context to supply power to a satellite, a space vehicle, and/or components thereof in the same or similar manner.

Solar power system 302 of FIG. 3 may include a solar array 304, a converter 306, one or more batteries 308, and an inverter 310. Solar array 304 has PV cells to convert solar radiation waves 112 into electrical energy in the form of a DC signal 314. Converter 306 may convert the DC signal 314 into another DC signal (e.g., a DC-to-DC converter) to charge one or more batteries 308. In some implementations, converter 306 may be or be referred to as a charging controller. In some implementations, processing may alternatively continue with or involve use of inverter 310, which may convert the DC signal into an AC signal to supply power to power utility 120.

As is apparent from the discussions of FIGS. 2 and 3, a solar power system may make use of a converter that is application-specific; the converter may be configured to receive a DC signal from a solar array and produce an application-specific signal based on the DC signal. For example, the converter may be a DC-to-RF converter coupled to a transmitter antenna array, configured to generate an RF signal based on the DC signal and generate an electromagnetic beam based on the RF signal for transmission (e.g., RF, microwave, or laser) toward a solar power receiving apparatus. Alternatively, for example, the converter may be a DC-to-DC converter, a DC-to-AC converter (e.g., or an inverter), or a charging controller.

As mentioned in the Background section, large temperature swings and angle of incidence (AOI) fluctuations cause (even optimized) solar arrays to produce large variations in voltage and power. Semiconductor bandgaps drop with increased temperature, leading to large drops in the voltage at maximum power (VMP). These variations may cause large efficiency degradations in DC-to-RF conversion and consequently large power losses in the system. These inefficiencies result in an even further rise in temperature, which degrades the system even further. DC-to-DC converters could be used to reduce the voltage conditions to the RF IC, battery, or regulation network. However, DC-to-DC converters suffer from limited efficiency which varies depending on conditions which include the voltage and power input. Using properly-designed, state-of-the-art DC-to-DC converters, efficiency might be in the range of 75% to 95%. Converters also rely on bulky external components including multiple capacitors and resistors.

What is needed is a reconfigurable solar array which is configured to provide a stable output voltage over a range of temperatures with high operational efficiency.

Figure 4:
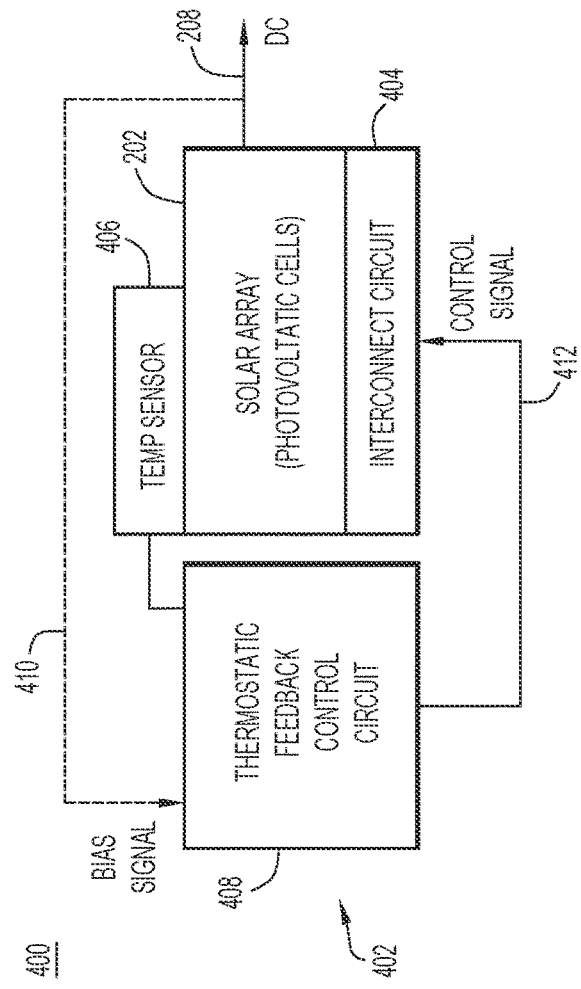
FIG. 4 is a schematic block diagram of a reconfigurable solar array according to some implementations of the present disclosure, where the reconfigurable solar array includes a plurality of photovoltaic (PV) cells, an interconnect circuit, a thermostatic feedback control circuit and a temperature sensor.

FIG. 4 is a schematic block diagram 400 of a reconfigurable solar array 402 according to some implementations of the present disclosure. The reconfigurable solar array 402 may replace the solar arrays in the solar power systems of FIGS. 1-3 as well as other types of solar power systems. Reconfigurable solar array 402 of FIG. 4 includes solar array 202 (e.g., like solar array 202 of FIG. 2 or solar array 304 of FIG. 3), an interconnect circuit 404, a temperature sensor 406, and a thermostatic feedback control circuit 408. Solar array 202 includes a plurality of PV cells and interconnect circuit 404 includes a plurality of switches for interconnecting the plurality of PV cells. Temperature sensor 406 may be disposed adjacent to and/or on one or more of the PV cells of solar array 202. In some implementations, temperature sensor 406 is or includes a resistor or a resistive element having a resistance that varies according to changes in ambient temperature. As temperature sensor 406 has a resistance that varies according to the temperature, thermostatic feedback control circuit 408 in communication with temperature sensor 406 is configured to produce a temperature signal (e.g., a voltage signal) in proportion to the temperature of at least some of the PV cells. Thermostatic feedback control circuit 408 is configured to cause at least one of the switches in interconnect circuit 404 to change state, via a control signal 412, at a preset temperature that is independent of supply voltage. In some implementations, such a temperature sensor may be disposed on each one of a plurality (e.g., some, many, or all) of the PV cells for providing a combined or average temperature of the PV cells.

In some implementations of FIG. 4, the plurality of switches of interconnect circuit 404 may be set in a first switch state to establish a first interconnection configuration of the PV cells of solar array 202, responsive to the temperature exceeding the preset temperature as signaled via the control signal 412. The first switch state/first interconnection configuration may be maintained over a first predetermined range of temperatures above the preset temperature (e.g., over a relatively high temperature range). On the other hand, the plurality of switches of interconnect circuit 404 may be set in a second switch state to establish a second interconnection configuration of the PV cells of solar array 202, responsive to the temperature falling below the preset temperature as signaled via the control signal 412. The second switch state/second interconnection configuration may be maintained over a second predetermined range of temperatures below the preset temperature (e.g., over a relatively lower temperature range).

Figure 5B:
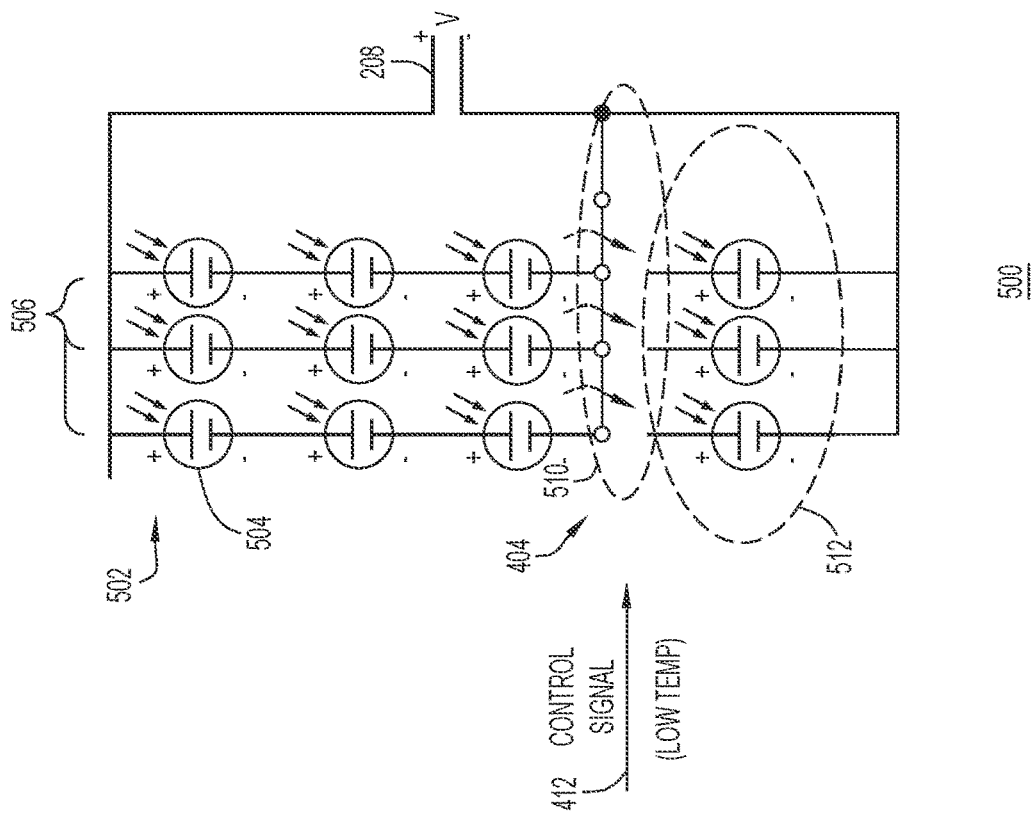
FIG. 5B is the basic schematic diagram of the first example of the plurality of PV cells of the reconfigurable solar array of FIG. 5A, where the switches are set in a second switch state based on the temperature to establish a second interconnection configuration of the plurality of PV cells.
Figure 5A:
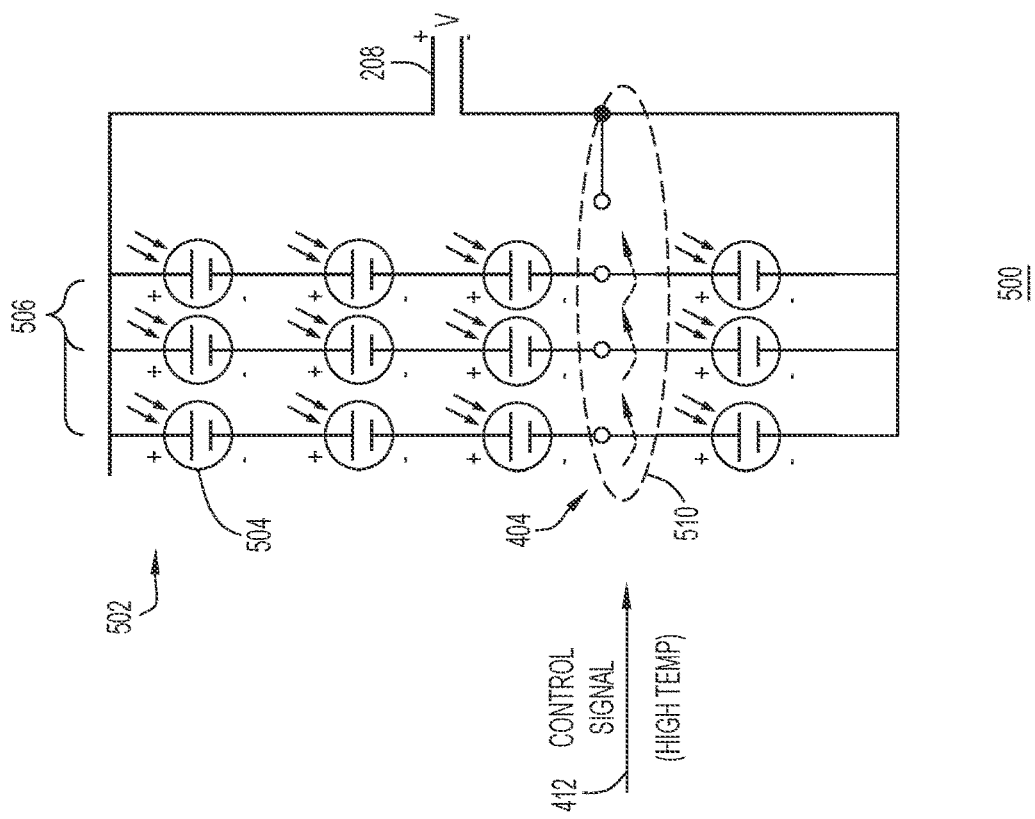
FIG. 5A is a basic schematic diagram of a first example of a plurality of PV cells of a reconfigurable solar array, which further includes an interconnect circuit including a plurality of switches for interconnecting the PV cells according to some implementations of the present disclosure, where the plurality of switches are shown to be set in a first switch state based on temperature to establish a first interconnection configuration of the plurality of PV cells.

FIG. 5A is a basic schematic diagram 500 of a first example of a plurality of photovoltaic cells 502 of a reconfigurable solar array, which further includes (at least part of) an interconnect circuit 404 including a plurality of switches 510 for interconnecting the photovoltaic cells according to some implementations of the present disclosure. In FIG. 5A (and the other figures that follow), each one of the photovoltaic cells 502 is indicated with use of a solar cell symbol according to standard convention (e.g., a photovoltaic cell 504 indicated with a solar cell symbol). The plurality of switches 510 may be or include single-pole-double-throw (SPDT) switches; however, any suitable type of switch may be utilized.

In general, the plurality of photovoltaic cells 502 are arranged in serially-connected groups along a plurality of strings 506 that are connected in parallel. Each serially-connected group in a given string may have the same number of photovoltaic cells as each one of the other strings. When the photovoltaic cells capture solar radiation signals, the solar array operates to produce the DC signal 208 between top and bottom ends of the strings as indicated.

More specifically in FIG. 5A, the plurality of switches 510 are shown to be set in a first switch state to establish a first interconnection configuration of the plurality of photovoltaic cells 502. In the first example of FIG. 5A that illustrates the first switch state and the first interconnection configuration, four (4) photovoltaic cells are provided in each serially-connected group in each one of three (3) strings that are connected in parallel (e.g., for a total of twelve (12) total cells). More generally, any suitable number of serially-connected groups of photovoltaic cells and parallel strings may be utilized in actual practice. The plurality of switches 510 may be set in the first switch state responsive to the temperature exceeding the preset temperature (i.e., via the control signal 412, "HIGH TEMP"). The first switch state/first interconnection configuration may be maintained over a first predetermined range of temperatures above the preset temperature.

FIG. 5B is the basic schematic diagram 500 of the first example of FIG. 5A, where the plurality of switches 510 are shown to be set in a second switch state to establish a second interconnection configuration of the plurality of photovoltaic cells 502. In the second switch state, at least one photovoltaic cell in each serially-connected group in each string is switchably disconnected from a respective string. More specifically, in the first example of FIG. 5B that illustrates the second switch state and the second interconnection configuration, three (3) photovoltaic cells are now provided in each serially-connected group in each one of the three (3) strings connected in parallel (e.g., for a total of nine (9) total cells), as one (1) photovoltaic cell in each serially-connected group along each string is switchably disconnected from a respective string (e.g., disconnected photovoltaic cells 512). More generally, any suitable number of photovoltaic cells in each serially-connected group may be provided for and remain in the second interconnection configuration in actual practice after the switching is performed. The plurality of switches 510 may be set in the second switch state responsive to the temperature falling below the preset temperature (i.e., via the control signal 412, "LOW TEMP"). The second switch state/second interconnection configuration may be maintained over a second predetermined range of temperatures that is below the preset temperature.

Using the above-described switching techniques, the maximum output voltage is reduced in order to improve conversion efficiency (e.g., DC-to-RF conversion efficiency). However, many disconnected photovoltaic cells 512 are not utilized in the second interconnection configuration (e.g., nine (9) photovoltaic cells in FIG. 5B as compared with twelve (12) photovoltaic cells in FIG. 5A,). Therefore, operational efficiency is low with the reconfigurable solar array of FIGS. 5A-5B.

Figure 6B:
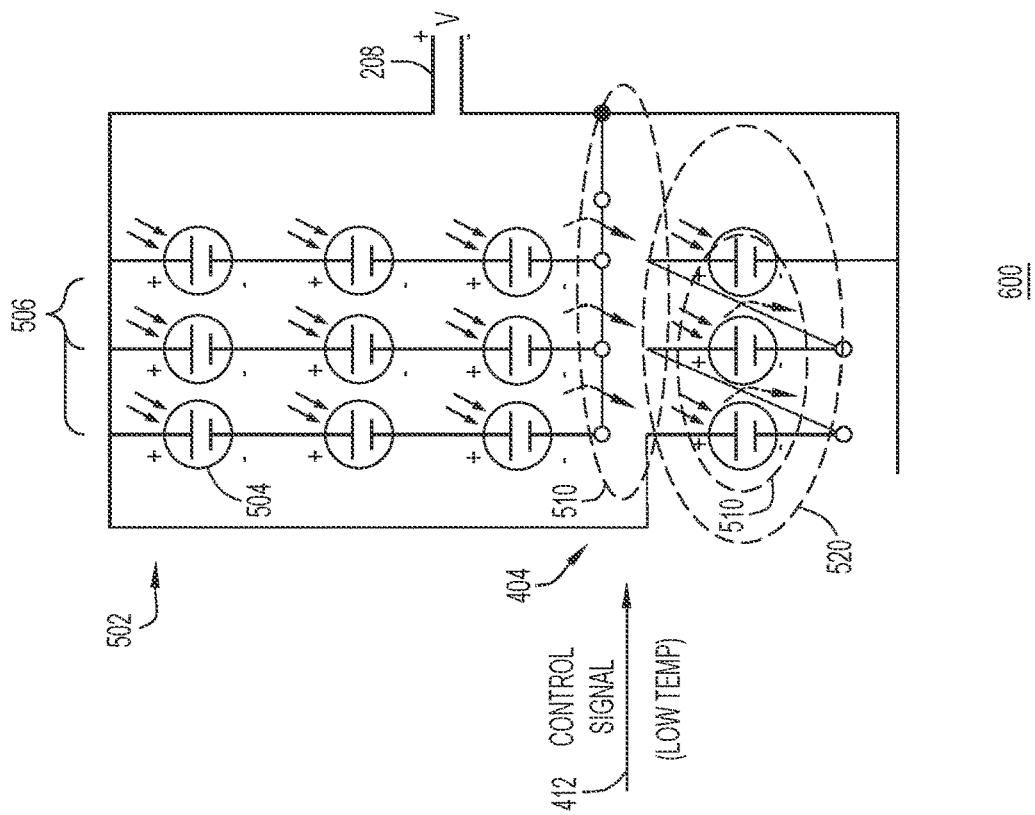
FIG. 6B is the basic schematic diagram of the second example of FIG. 6A, where the plurality of switches are shown to be set in a second switch state based on the temperature to establish a second interconnection configuration of the plurality of PV cells.
Figure 6A:
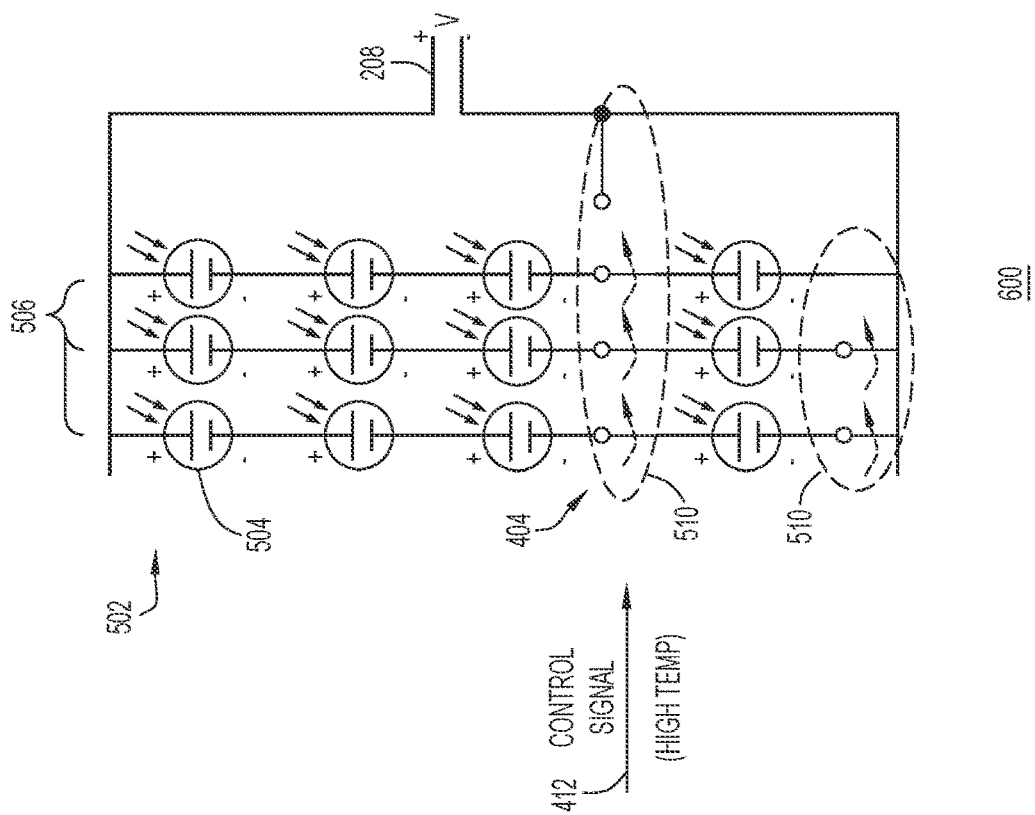
FIG. 6A is a basic schematic diagram of a second example of a plurality of PV cells of a reconfigurable solar array, which further includes an interconnect circuit including a plurality of switches for interconnecting the PV cells according to some implementations of the present disclosure, where the plurality of switches are shown to be set in a first switch state based on temperature to establish a first interconnection configuration of the plurality of PV cells.

FIG. 6A is a basic schematic diagram 600 of a second example of the plurality of photovoltaic cells 502 of the reconfigurable solar array, which includes (at least part of) the interconnect circuit 404 including the plurality of switches 510 for interconnecting the photovoltaic cells according to some implementations of the present disclosure. In FIG. 6A, the plurality of switches 510 are shown to be set in a first switch state to establish a first interconnection configuration of the plurality of photovoltaic cells 502, where the resulting interconnection is the same as or similar to that shown and described in relation to the first example of FIG. 5A. In the second example of FIG. 6A that illustrates the first switch state and the first interconnection configuration, four (4) photovoltaic cells are again provided in each serially-connected group in each one of three (3) strings that are connected in parallel (e.g., for a total of twelve (12) total cells). The plurality of switches 510 may be set in the first switch state responsive to the temperature exceeding the preset temperature (i.e., via the control signal 412, "HIGH TEMP"). The first switch state/first interconnection configuration may be maintained over a first predetermined range of temperatures above the preset temperature.

FIG. 6B is the basic schematic diagram 600 of the second example of FIG. 6A, where the plurality of switches 510 are shown to be set in a second switch state to establish a second interconnection configuration of the plurality of photovoltaic cells 502. In the second switch state, at least one photovoltaic cell in each serially-connected group of each string is disconnected from a respective string and at least some of these cells are reconnected in series to each other to form a new string connected in parallel to the other strings. More specifically, in the second example of FIG. 6B that illustrates the second switch state and the second interconnection configuration, three (3) photovoltaic cells are now provided in each serially-connected group in each one of the strings. In addition, one (1) photovoltaic cell in each serially-connected group along each string is switchably disconnected from a respective string, resulting in three (3) disconnected photovoltaic cells 520, and (at least some of) these cells are reconnected in series to each other to form a new serially-connected group along a new string that is connected in parallel to the other strings, thereby providing four (4) strings that are connected in parallel (e.g., for a total of 3×4=twelve (12) total cells). The plurality of switches 510 may be set in the second switch state responsive to the temperature falling below the preset temperature (i.e., via the control signal 412, "LOW TEMP"), and the second switch state/second interconnection configuration may be maintained over a second predetermined range of temperatures that is below the preset temperature.

As is apparent, many or all of the disconnected photovoltaic cells 520 are reconnected and therefore reutilized in the second interconnection configuration (e.g., twelve (12) photovoltaic cells in FIG. 6A and twelve (12) photovoltaic cells in FIG. 6B). Therefore, operational efficiency is high with the reconfigurable solar array of FIGS. 6A-6B.

Thus, the reconfigurable solar array may be designed such that the first and the second interconnection configurations offer a "perfect" or optimal reuse of photovoltaic cells; that is, the number of utilized photovoltaic cells in the first interconnection configuration may be designed to be the same as the number of utilized photovoltaic cells in the second interconnection configuration. For example, the reconfigurable solar array may be designed such that the number of photovoltaic cells in each serially-connected group is one (1) greater than the number of strings that are connected in parallel (where one (1) photovoltaic cell will be disconnected per serially-connected group and then reconnected), to result in a "perfect" or optimal reuse of the photovoltaic cells (e.g., four (4) photovoltaic cells by three (3) strings to result in perfect reuse of twelve (12) photovoltaic cells; five (5) photovoltaic cells by four (4) strings to result in perfect reuse of twenty (20) twelve photovoltaic cells; etc.).

In other possible implementations, at least some photovoltaic cells may not be reused upon switching, for a slightly less-than-optimal reuse of cells. For example, the reconfigurable solar array may be designed such that the number of photovoltaic cells in each serially-connected group is the same as the number of strings that are connected in parallel, where one (1) photovoltaic cell is disconnected for each serially-connected group (string) and then reconnected in series, except for one (1) photovoltaic cell which is not reused (e.g., four (4) photovoltaic cells by four (4) strings, followed by switching to three (3) photovoltaic cells by five (5) strings to thereby result in reuse of fifteen (15) of the sixteen (16) photovoltaic cells).

Figure 7B:
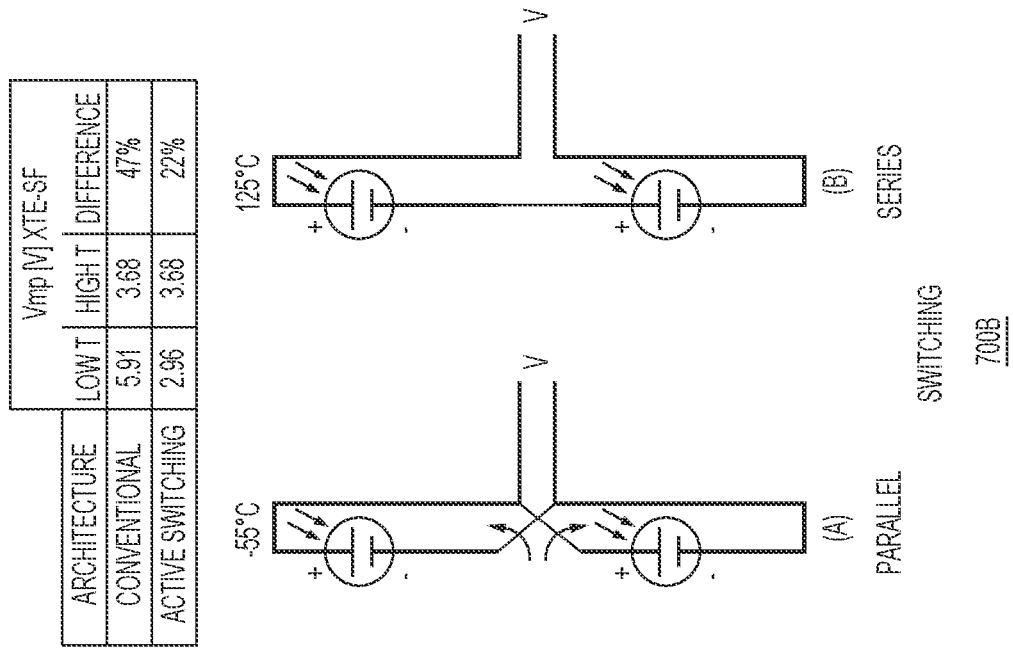
FIGS. 7A and 7B are basic schematic diagrams of strings of PV cells having various interconnection configurations for analysis of output voltages over temperature.
Figure 7A:
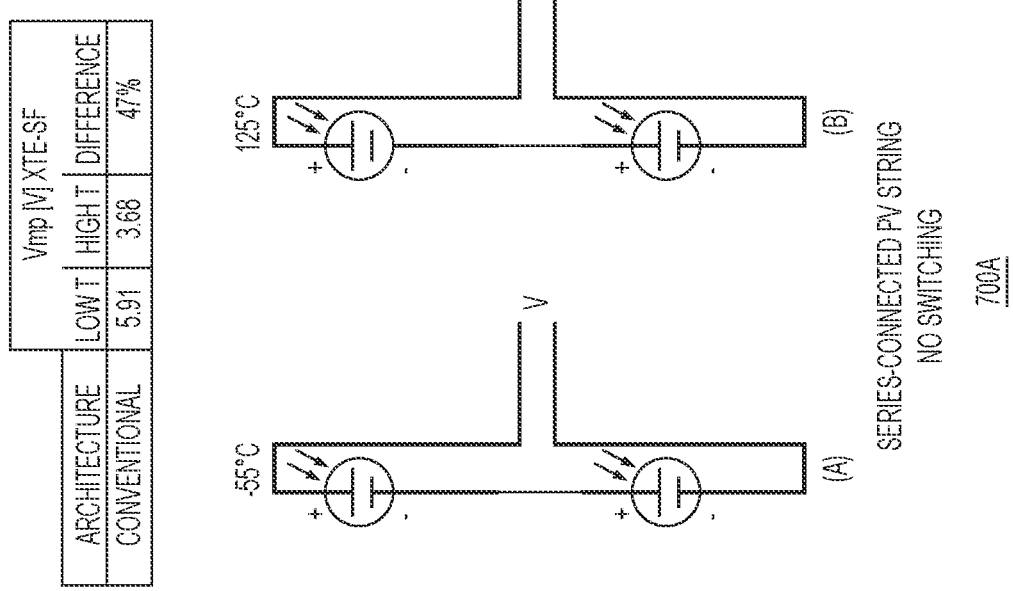

FIGS. 7A and 7B are basic schematic diagrams 700A and 700B of strings of PV cells having various interconnection configurations for analysis of output voltages over temperature.

More particularly, FIG. 7A shows basic schematic diagram 700A of a string of PV cells at (A) having an interconnection configuration (i.e., a series-connected configuration) at a first temperature state. FIG. 7A shows the same string of PV cells at (B) in the same interconnection configuration (i.e., the series-connected configuration) at a second temperature state (i.e., no switching provided over temperature). As indicated, the series-connected string of PV cells at (A) provides a DC output voltage of 5.91 volts (V) at a relatively low temperature of −55° C. On the other hand, the series-connected string of PV cells at (B) having the same interconnection configuration provides a DC output voltage of 3.68 V at a relatively high temperature of 125° C. The percentage difference in output voltage between these temperatures is 47%.

In comparison, FIG. 7B shows basic schematic diagram 700B of a string of PV cells at (A) having an interconnection configuration (i.e., a parallel-connected configuration) at a first temperature state. FIG. 7B shows the same string of PV cells at (B) with a different interconnection configuration (i.e., a series-connected configuration) at a second temperature state (i.e., switching provided over temperature). As indicated, the parallel-connected string of PV cells at (A) provides a DC output voltage of 2.96 V at the relatively low temperature of −55° C. On the other hand, the series-connected string of PV cells at (B) having the different interconnection configuration provides a DC output voltage of 3.68 V at the relatively high temperature of 125° C. The percentage difference in output voltage between these temperatures is 22%, which is greatly reduced as compared to 47% in relation to FIG. 7A described above.

As is apparent, the maximum output voltage may be reduced with use of the switching configuration techniques of the present disclosure, for thereby providing a substantially reduced temperature sensitivity of VMP. The reduced output voltage swings may substantially improve DC-to-RF conversion efficiency. Interconnection configurations based on FIGS. 5A-5B provide for VMP stabilization, albeit with some power loss due to unused PV cells. On the other hand, interconnection configurations based on FIGS. 6A-6B (and, e.g., FIG. 7B) provide for VMP stabilization with a reduced or minimal solar array power loss.

FIG. 8A is a perspective view of a flexible printed circuit board 802 which may form part of a reconfigurable solar array 800 according to some implementations of the present disclosure. As illustrated, flexible printed circuit board 802 is formed with a plurality of photovoltaic cells 804 (e.g., a photovoltaic cell 806), in what may be referred to as a "tile" of the reconfigurable solar array 800. In the example of FIG. 8A, reconfigurable solar array 800 is designed with the same or similar interconnection configuration as that shown and described in relation to FIG. 5A-5B or 6A-6B (i.e., four (4)×three (3)=twelve (12) photovoltaic cells as provided in the first interconnection configuration). In some implementations, flexible printed circuit board 802 is part of a multi-layered flex circuit for the reconfigurable solar array 800.

Flexible printed circuit board 802 having the plurality of photovoltaic cells 804 may carry at least some electrical circuitry (e.g., electrical circuitry 808) and conductive traces (e.g., conductive traces 812) in order to provide electrical interconnection of cells and components. In some implementations, the electrical circuitry on flexible printed circuit board 802 may include at least an interconnect circuit and a temperature sensor (e.g., see FIG. 4). One or more electrical connectors 810 may be used to provide an interface for the interconnection of electrical circuitry and to provide an output voltage of reconfigurable solar array 800.

More specifically with reference to FIG. 8B, flexible printed circuit board 802 may carry a temperature sensor which is made of a microstrip trace 850 (e.g., a copper trace) disposed along flexible printed circuit board 802. Microstrip trace 850 of flexible printed circuit board 802 has a resistance that varies according to variations in temperature (e.g., the resistance increases as the temperature increases). Microstrip trace 850 may be designed with particular dimensions to exhibit a predetermined resistance (e.g., a nominal but varying resistance over temperature) with use of conventional microstrip design practices. For example, a resistance of microstrip trace 850 may be determined based on a plurality of variables, including one or more of a width, a thickness, a ground plane thickness, a length, a relative conductivity, and a relative permeability of the microstrip trace. In some implementations, microstrip trace 805 is designed to have a resistance which is relatively low, for example, between about 50-100 ohms (e.g., 47 ohms).

In the example of FIG. 8B, microstrip trace 850 is designed to extend around the entire flexible printed circuit board 802 (e.g., extending around many or most photovoltaic cells that surround the entire solar array). In some other implementations, microstrip trace 850 may be designed with particular dimensions to extend across at least one (1) dimension of flexible printed circuit board 802 from end to end (i.e., extending across many or most photovoltaic cells in a single row or column of the array along its edge). In other implementations, microstrip trace 850 may be designed to extend across at least two (2) dimensions of flexible printed circuit board from end to end (i.e., extending across many or most photovoltaic cells in a row and column of the array along their edges or otherwise).

Figure 9:
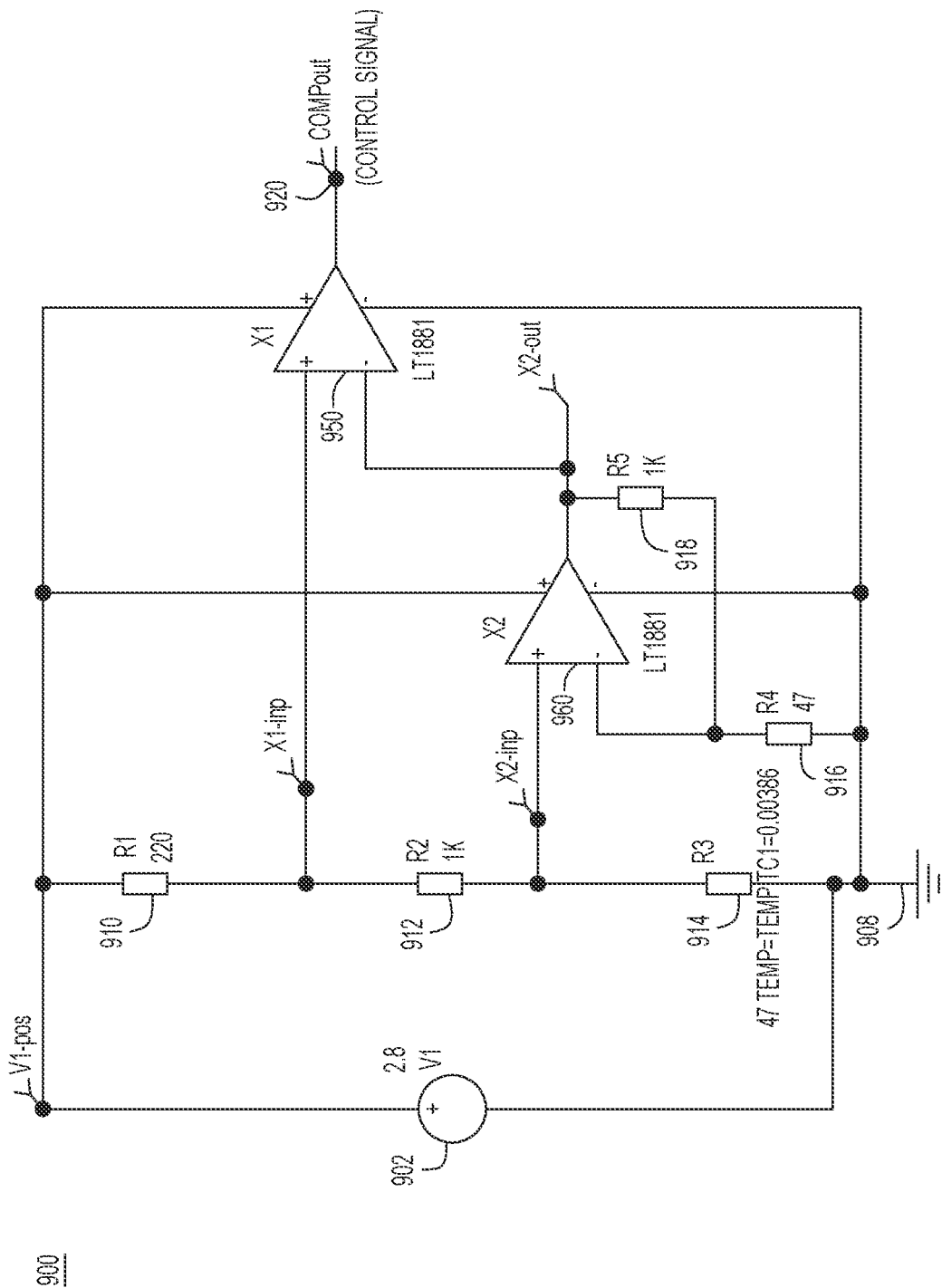
FIG. 9 is a schematic diagram of one example of a thermostatic feedback control circuit according to some implementations of the present disclosure.

FIG. 9 is a schematic diagram 900 of one example of thermostatic feedback control circuit according to some implementations of the present disclosure. Thermostatic feedback control circuit of FIG. 9 may include a voltage source 902 (V1) which is or is based on the PV cell voltage, resistors 910, 912, 916, and 918 (R1, R2, R4, and R5, respectively), a temperature sensor 914 (R3), and operational amplifiers 950 and 960 (e.g., X1 and X2, respectively). Operational amplifiers 950 and 960 (X1 and X2) are coupled to voltage source 902 (V1) (i.e., the PV cell voltage) as their supply voltage for operation. The thermostatic feedback control circuit may configure one or more of the operational amplifiers 950 and 960 (X1 and X2) to operate as comparators.

In the circuit configuration, resistor 910 (R1), resistor 912 (R2), and temperature sensor 914 (R3) are coupled in series across the voltage source 902 (V1), extending between V1-pos and a ground node 908 of the circuit. Operational amplifier 960 (X2) has a positive input (X2-inp) coupled between resistor 912 (R2) and temperature sensor 914 (R3), and a negative input that is coupled to ground node 908 via resistor 916 (R4). An output (X2-out) of operational amplifier 960 (X2) is coupled to its negative input via resistor 918 (R5) and also to the negative input of operational amplifier 950 (X1). Operational amplifier 950 (X1) has a positive input (X1-inp) coupled between resistor 910 (R1) and resistor 912 (R2). Notably, no (regulated) voltage or current reference required for thermostatic feedback control circuit 408.

In FIG. 9, temperature sensor 914 may be a resistance temperature detector. Here, temperature sensor 914 may have a resistance that varies according to variations in the temperature (e.g., the resistance increases as the temperature of the sensor increases). In some implementations, where the plurality of photovoltaic cells are formed with use of a flexible printed circuit board which carries at least the temperature sensor 914, the temperature sensor may be formed as a microstrip trace (e.g., a copper trace) disposed along the flexible printed circuit board (see, e.g., FIGS. 8A and 8B).

Figure 10:
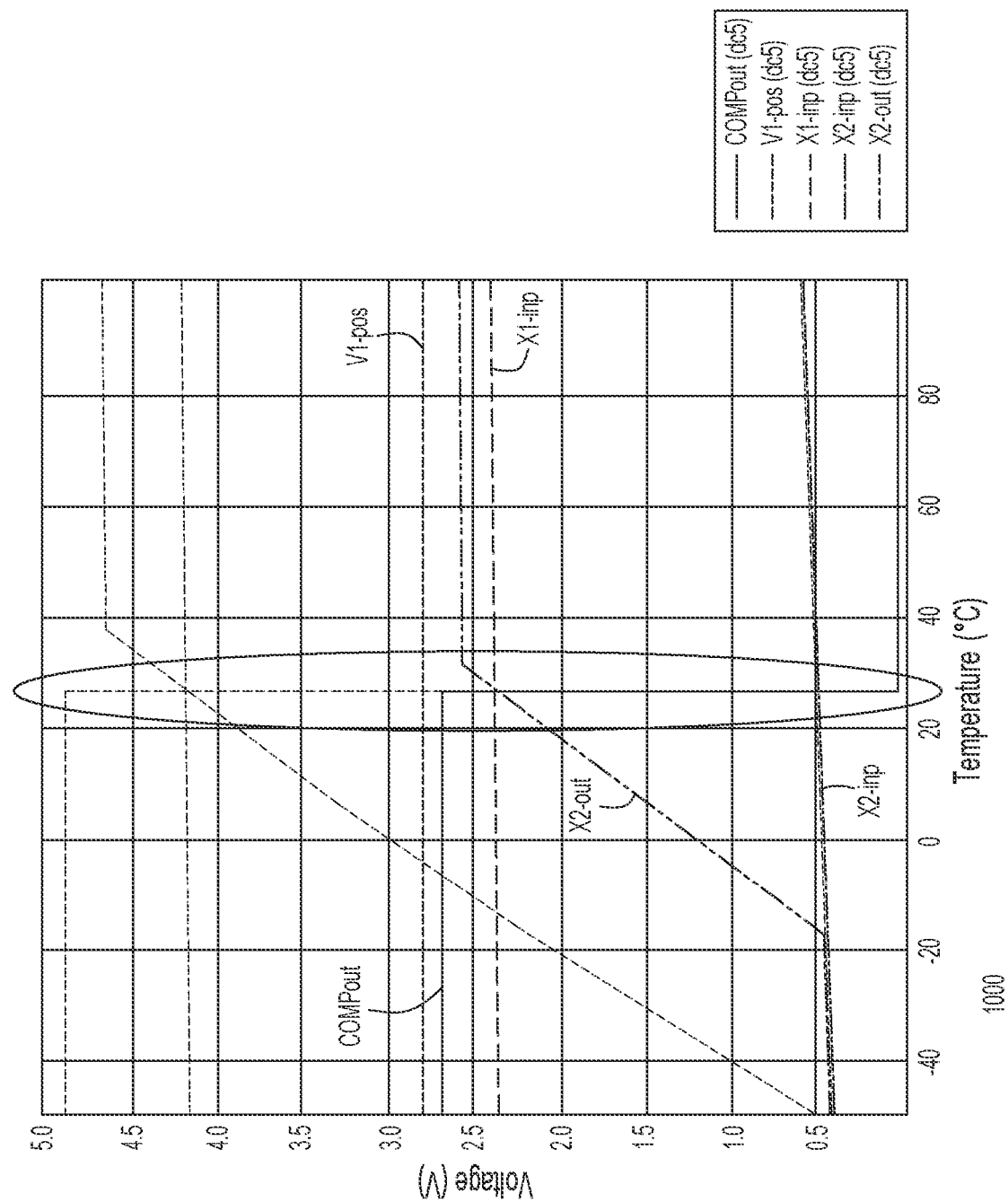
FIG. 10 is a graph of relationships between voltage and solar array temperature for a plurality of voltages taken at a plurality of nodes of the thermostatic feedback control circuit of FIG. 9.

The discussion of thermostatic feedback control circuit of FIG. 9 continues now with additional reference to FIG. 10, which shows a graph 1000 of relationships between voltage and solar array temperature for a plurality of voltages taken at a plurality of nodes of the thermostatic feedback control circuit of FIG. 9 (i.e., COMP-out, V1-pos, X1-inp, X2-inp, and X2-out).

Thermostatic feedback control circuit of FIG. 9 is configured to switch state at a fixed, preset temperature $T_{SW}$, which is based on the resistance of temperature sensor 914. The preset temperature $T_{SW}$ or "set point" is independent of supply voltage. During operation, a gradual increase in temperature (e.g., from −40° C. to 80° C.) of temperature sensor 914 causes a gradual increase in the voltage at X2-inp (e.g., a slower-rising voltage), while the voltages at V1-pos and X1-inp remain relatively constant and stable over the temperature range. The gradual increase in the voltage at X2-inp is input to operational amplifier 960 (X2), which amplifies the voltage at X2-out so that it rises faster (e.g., a faster-rising voltage) than the voltage at the X2-input. At the set point, operational amplifier 950 (X1) may provide a (switching) control signal 920 at COMPout at the preset temperature $T_{SW}$.

FIG. 11 is a flowchart 1100 for describing a method for use in operating a reconfigurable solar array according to some implementations of the present disclosure. To begin at a start block 1102 of FIG. 11, a solar array including a plurality of photovoltaic cells and an interconnect circuit including a plurality of switches for interconnecting the plurality of photovoltaic cells are provided (step 1104 of FIG. 11). A temperature signal in proportion to a temperature of at least some of the plurality of photovoltaic cells is produced (step 1106 of FIG. 11). The plurality of switches may be set in a first switch state responsive to the temperature exceeding a preset temperature independent of supply voltage, such that the plurality of photovoltaic cells are arranged in serially-connected groups along a plurality of strings that are connected in parallel (step 1108 of FIG. 11). The plurality of switches may be alternatively set in a second switch state responsive to the temperature falling below the preset temperature independent of the supply voltage, such that at least one photovoltaic cell in each serially-connected group of each string is disconnected from a respective string and (each one of at least some of these photovoltaic cells are) reconnected in series to each other to form a new serially-connected group along a new string that is connected in parallel to the other strings (step 1110 of FIG. 11).

In some implementations, the method of FIG. 11 may further include operating the reconfigurable solar array which includes the plurality of photovoltaic cells to receive solar radiation signals and to convert the solar radiation signals into a DC signal. In some implementations, all of the plurality of photovoltaic cells are connected for use in receiving and converting solar radiation signals in both the first and the second switch states (e.g., in both the first and the second interconnection configurations), for optimal reuse of photovoltaic cells. In some implementations, the DC signal is relatively stable over a range of temperatures of the plurality of photovoltaic cells in the first and the interconnection configurations. In some implementations, producing the temperature signal may be performed with use of a thermostatic feedback control circuit in communication with a temperature sensor which has a resistance that varies according to variations in the temperature. Here, the thermostatic feedback control circuit may include first and second operational amplifiers, where the first operational amplifier has an input coupled to an end of the temperature sensor to receive variations in voltage according to the variations in the temperature, and the second operational amplifier has an input coupled to an output of the first operational amplifier, and an output for producing a control signal to set the plurality of switches in one of the first switch state or the second switch state. The first and the second operational amplifiers may be coupled to the supply voltage which is based on photovoltaic cell output voltage.

Thus, as described herein, a reconfigurable solar array is configured to provide a stable output voltage over a range of temperatures with high operational efficiency. The innovative concepts of the present disclosure provide a unique approach for the handling of a wide range of conditions that a solar array may be exposed to, including sun AOI and temperature, in order to present a stable voltage and power at its output. By fluidly reconfiguring solar cell electrical connections, the solar arrays may produce substantially reduced voltage and power variations. Solar cells may be arranged in parallel or in series, and the count of solar cells in a given string may be lessened or increased. A thermo-dynamic control loop (i.e., using the thermostatic feedback control circuit) may rapidly recognize and adjust for temperature conditions autonomously, relieving the need for complex and massive array signal and control wiring. The present approach also minimizes the need for inefficient, broad operating voltage regulation, and creates optimal and stable conditions for power management and distribution, whether it be direct DC-to-RF conversion, DC-DC conversion, or battery charging.

In one illustrative example of the present disclosure, a reconfigurable solar array comprises a plurality of photovoltaic cells; an interconnect circuit including a plurality of switches for interconnecting the plurality of photovoltaic cells; a thermostatic feedback control circuit in communication with a temperature sensor configured to produce a temperature signal in proportion to a temperature of at least some of the plurality of photovoltaic cells; where the thermostatic feedback control circuit is configured to cause at least one of the switches in the interconnect circuit to change state at a preset temperature independent of supply voltage.

In some implementations, the thermostatic feedback control circuit may be configured to cause the plurality of photovoltaic cells to be arranged in a plurality of strings connected in parallel when the temperature of the plurality of photovoltaic cells is above the preset temperature. Further, the thermostatic feedback control circuit may be configured to cause at least one photovoltaic cell in each string to be disconnected from a respective string when the temperature of the plurality of photovoltaic cells is at or below the preset temperature. Even further, the thermostatic feedback control circuit may be configured to cause the photovoltaic cells disconnected from respective strings to be reconnected in series to each other to form a new string that is connected in parallel to the other strings when the temperature of the plurality of photovoltaic cells is at or below the preset temperature.

In some implementations, the interconnect circuit may operate to set the plurality of photovoltaic cells in one of a first interconnection configuration or a second interconnection configuration based on the temperature. The reconfigurable solar array is configured to receive solar radiation signals and to convert the solar radiation signals into a DC signal. In some implementations, all of the plurality of photovoltaic cells are connected for use in receiving and converting the solar radiation signals in both the first and the second interconnection configurations, for optimal reuse of photovoltaic cells. In some implementations, the DC signal may be relatively stable over a range of temperatures of the plurality of photovoltaic cells in the first and the second interconnection configurations.

In some implementations, the temperature sensor may have a resistance that varies according to variations in the temperature. Here, the thermostatic feedback control circuit may include first and second operational amplifiers. The first operational amplifier may have an input coupled to an end of the temperature sensor to receive variations in voltage according to the variations in the temperature. The second operational amplifier may have an input coupled to an output of the first operational amplifier, and have an output for producing a control signal to cause the at least one of the switches in the interconnect circuit to change state at the preset temperature independent of the supply voltage. In some implementations, the first and the second operational amplifiers may be coupled to the supply voltage which is based on photovoltaic cell output voltage.

In some implementations, the plurality of photovoltaic cells may be formed with use of a flexible printed circuit board which carries at least the interconnect circuit and the temperature sensor. Here, the temperature sensor may be made of a microstrip trace disposed along the flexible printed circuit board, where the microstrip trace has a resistance that varies according to variations in the temperature.

In another illustrative example of the present disclosure, a solar power system may comprise a reconfigurable solar array configured to receive solar radiation signals and to convert the solar radiation signals into a DC signal, and a converter configured to receive the DC signal and to produce an application-specific signal based on the DC signal. The reconfigurable solar array may include a plurality of photovoltaic cells; an interconnect circuit including a plurality of switches for interconnecting the plurality of photovoltaic cells; a thermostatic feedback control circuit in communication with a temperature sensor configured to produce a temperature signal in proportion to a temperature of at least some of the plurality of photovoltaic cells; where the thermostatic feedback control circuit is configured to cause at least one of the switches in the interconnect circuit to change state at a preset temperature independent of supply voltage.

In some implementations, the solar power system having the reconfigurable solar array may include the additional or alternative features and components of the reconfigurable solar array described earlier above. Also in some implementations, the converter may be a DC-to-RF converter coupled to a transmitter antenna array, configured to generate an RF signal based on the DC signal and an electromagnetic beam based on the RF signal for transmission toward a solar power receiving apparatus. In some other implementations, the converter may be a DC-to-DC converter, a DC-to-AC converter, or a charging controller.

In yet another illustrative example of the present disclosure, a method is provided for use with a solar array including a plurality of photovoltaic cells and an interconnect circuit including a plurality of switches for interconnecting the plurality of photovoltaic cells, where the method comprises producing a temperature signal in proportion to a temperature of at least some of the plurality of photovoltaic cells; setting the plurality of switches in a first switch state responsive to the temperature exceeding a preset temperature, such that the plurality of photovoltaic cells are arranged in serially-connected groups along a plurality of strings that are connected in parallel; and setting the plurality of switches in a second switch state responsive to the temperature falling below the preset temperature, such that at least one photovoltaic cell in each serially-connected group of each string is disconnected from a respective string and each one of at least some of these photovoltaic cells are reconnected in series to each other to form a new serially-connected group along a new string that is connected in parallel to the other strings.

In some implementations, the method may further include operating the reconfigurable solar array which includes the plurality of photovoltaic cells to receive solar radiation signals and to convert the solar radiation signals into a DC signal. In some implementations, all of the plurality of photovoltaic cells may be connected for use in receiving and converting the solar radiation signals in both the first and the second interconnection configurations, for optimal reuse of photovoltaic cells. In some implementations, the DC signal is relatively stable over a range of temperatures of the plurality of photovoltaic cells in the first and the interconnection configurations. In some implementations, the step of producing the temperature signal may be performed with use of a thermostatic feedback control circuit in communication with a temperature sensor which has a resistance that varies according to variations in the temperature. Here, the thermostatic feedback control circuit may include first and second operational amplifiers, where the first operational amplifier has an input coupled to an end of the temperature sensor to receive variations in voltage according to the variations in the temperature, and the second operational amplifier has an input coupled to an output of the first operational amplifier, and an output for producing a control signal to set the plurality of switches in one of the first switch state or the second switch state. In some implementations, the first and the second operational amplifiers may be coupled to the supply voltage which is based on photovoltaic cell output voltage.

The invention claimed is:

1. A reconfigurable solar array comprising:
    a plurality of photovoltaic cells;
    an interconnect circuit including a plurality of switches for interconnecting the plurality of photovoltaic cells;
    a thermostatic feedback control circuit in communication with a temperature sensor, configured to produce a temperature signal in proportion to a temperature of at least some of the plurality of photovoltaic cells, the temperature sensor having a resistance that varies according to variations in the temperature, and the thermostatic feedback control circuit including:
        first and second operational amplifiers coupled to a supply voltage which is based on photovoltaic cell output voltage;
        wherein the first operational amplifier has an input coupled to the temperature sensor to receive variations in voltage according to the variations in the temperature, and
        wherein the second operational amplifier has an input coupled to an output of the first operational amplifier, and has an output for producing a control signal to cause at least one of the switches in the interconnect circuit to change state at a preset temperature independent of the supply voltage.

2. The reconfigurable solar array of claim 1, wherein:
    the interconnect circuit operates to set the plurality of photovoltaic cells in one of a first interconnection configuration or a second interconnection configuration based on the temperature,
    the reconfigurable solar array is configured to receive solar radiation signals and to convert the solar radiation signals into a direct current (DC) signal, and
    all of the plurality of photovoltaic cells are connected for use in receiving and converting the solar radiation signals in both the first and the second interconnection configurations, for optimal reuse of the plurality of photovoltaic cells.

3. The reconfigurable solar array of claim 2, wherein:
    the DC signal is relatively stable over a range of temperatures of the plurality of photovoltaic cells in the first and the second interconnection configurations.

4. The reconfigurable solar array of claim 1, wherein:
    the plurality of photovoltaic cells are formed with use of a flexible printed circuit board which carries at least the interconnect circuit and the temperature sensor,
    the temperature sensor is made of a microstrip trace disposed along the flexible printed circuit board, and
    the microstrip trace has a resistance that varies according to variations in the temperature.

5. The reconfigurable solar array of claim 1, wherein the thermostatic feedback control circuit is configured to cause the plurality of photovoltaic cells to be arranged in a plurality of strings connected in parallel when the temperature of the plurality of photovoltaic cells is above the preset temperature.

6. The reconfigurable solar array of claim 5, wherein the thermostatic feedback control circuit is configured to cause at least one photovoltaic cell in each string to be disconnected from a respective string when the temperature of the plurality of photovoltaic cells is at or below the preset temperature.

7. The reconfigurable solar array of claim 6, wherein the thermostatic feedback control circuit is configured to cause the photovoltaic cells disconnected from respective strings to be reconnected in series to each other to form a new string that is connected in parallel to the other strings when the temperature of the plurality of photovoltaic cells is at or below the preset temperature.

8. A solar power system comprising:
a reconfigurable solar array configured to receive solar radiation signals and to convert the solar radiation signals into a direct current (DC) signal;
a converter configured to receive the DC signal and to produce an application-specific signal based on the DC signal;
the reconfigurable solar array including:
a plurality of photovoltaic cells;
an interconnect circuit including a plurality of switches for interconnecting the plurality of photovoltaic cells;
a thermostatic feedback control circuit in communication with a temperature sensor, configured to produce a temperature signal in proportion to a temperature of at least some of the plurality of photovoltaic cells, the temperature sensor having a resistance that varies according to variations in the temperature, and the thermostatic feedback control circuit including:
first and second operational amplifiers coupled to a supply voltage which is based on photovoltaic cell output voltage;
wherein the first operational amplifier has an input coupled to the temperature sensor to receive variations in voltage according to the variations in the temperature, and
wherein the second operational amplifier has an input coupled to an output of the first operational amplifier, and has an output for producing a control signal to cause at least one of the switches in the interconnect circuit to change state at a preset temperature independent of the supply voltage.

9. The solar power system of claim 8, wherein:
the interconnect circuit operates to set the plurality of photovoltaic cells in one of a first interconnection configuration or a second interconnection configuration based on the temperature,
the DC signal is relatively stable over a range of temperatures of the plurality of photovoltaic cells in the first and the second interconnection configurations.

10. The solar power system of claim 8, wherein:
the plurality of photovoltaic cells are formed with use of a flexible printed circuit board which carries at least the interconnect circuit and the temperature sensor,
the temperature sensor is made of a microstrip trace disposed along the flexible printed circuit board, and
the microstrip trace has a resistance that varies according to variations in the temperature.

11. The solar power system of claim 8, wherein the converter comprises a DC to radio frequency (RF) (DC-to-RF) converter coupled to a transmitter antenna array, configured to generate an RF signal based on the DC signal and an electromagnetic beam based on the RF signal for transmission toward a solar power receiving apparatus.

12. The solar power system of claim 8, wherein the converter comprises one of a DC-to-DC converter, a DC-to-AC converter, or a charging controller.

13. The solar power system of claim 8, wherein the thermostatic feedback control circuit is configured to cause the plurality of photovoltaic cells to be arranged in a plurality of strings connected in parallel when the temperature of the plurality of photovoltaic cells is above the preset temperature, and wherein the thermostatic feedback control circuit is further configured to cause at least one photovoltaic cell in each string to be disconnected from a respective string and reconnected in series to each other to form a new string that is connected in parallel to the other strings when the temperature of the plurality of photovoltaic cells is at or below the preset temperature.

14. A method of a reconfigurable solar array including a plurality of photovoltaic cells and an interconnect circuit including a plurality of switches for interconnecting the plurality of photovoltaic cells, the method comprising:
producing with a thermostatic feedback control circuit in communication with a temperature sensor, a temperature signal in proportion to a temperature of at least some of the plurality of photovoltaic cells, the temperature sensor having a resistance that varies according to variations in the temperature, and the thermostatic feedback control circuit including:
first and second operational amplifiers coupled to a supply voltage which is based on photovoltaic cell output voltage;
wherein the first operational amplifier has an input coupled to the temperature sensor to receive variations in voltage according to the variations in the temperature, and
wherein the second operational amplifier has an input coupled to an output of the first operational amplifier, and has an output for producing a control signal to cause the at least one of the switches in the interconnect circuit to change state at the preset temperature independent of the supply voltage;
setting the plurality of switches in a first switch state responsive to the temperature exceeding a preset temperature independent of the supply voltage, such that the plurality of photovoltaic cells are arranged in serially-connected groups along a plurality of strings that are connected in parallel; and
setting the plurality of switches in a second switch state responsive to the temperature falling below the preset temperature independent of the supply voltage, such that at least one photovoltaic cell in each serially-connected group of each string is disconnected from a respective string and each one of at least some of these photovoltaic cells are reconnected in series to each other to form a new serially-connected group along a new string that is connected in parallel to the other strings.

15. The method of claim 14, wherein the control signal is configured to set the plurality of switches in one of the first switch state or the second switch state.

16. The method of claim 14, further comprising:
operating the reconfigurable solar array which includes the plurality of photovoltaic cells to receive solar radiation signals and to convert the solar radiation signals into a direct current (DC) signal, and all of the plurality of photovoltaic cells are connected for use in receiving and converting the solar radiation signals in both the first and the second interconnection configurations, for optimal reuse of the plurality of photovoltaic cells.

17. The method of claim 16, wherein the DC signal is relatively stable over a range of temperatures of the plurality of photovoltaic cells in the first and the second interconnection configurations.

* * * * *